United States Patent [19]
Maag et al.

[11] Patent Number: 5,712,591
[45] Date of Patent: Jan. 27, 1998

[54] PARALLEL PREAMPLIFIER AND EQUALIZER

[75] Inventors: Clifford Maag, Provo; Lance Parker, Orem, both of Utah

[73] Assignee: Night Technologies International, Provo, Utah

[21] Appl. No.: 630,412

[22] Filed: Apr. 2, 1996

Related U.S. Application Data

[60] Provisional application No. 60/004,950, Oct. 3, 1995.
[51] Int. Cl.⁶ .................................................. H03F 3/68
[52] U.S. Cl. ........................................ 330/84; 330/124 R
[58] Field of Search ........................ 330/69, 84, 124 R; 381/120, 121

[56] References Cited

U.S. PATENT DOCUMENTS

4,631,490  12/1986  Takahashi .................. 330/124 R X
4,786,878  11/1988  Botti ................................ 330/84

*Primary Examiner*—Steven Mottola
*Attorney, Agent, or Firm*—Thorpe North & Western, LLP

[57] ABSTRACT

A preamplifier for processing an audio signal includes an equalizing and amplifying circuit comprised of parallel operational amplifiers, each with a feedback impedance circuit and an adjustable source impedance circuit. The adjustable source impedance circuit provides the preamplifier with a super-gain region in the high audio and supersonic frequency range. A summer adds the output of the parallel operational amplifiers to produce a single output signal. The parallel operational amplifiers, with the summer, gives the preamplifier unique low noise characteristic with an improved signal to noise ratio over a single operational amplifier with the same gain. The preamplifier may include an optional second stage for further equalizing and amplifying of the output signal.

21 Claims, 9 Drawing Sheets

PARALLEL PREAMPLIFIER AND EQUALIZER

This is a continuation of provisional patent application Ser. No. 60/004,950, filed Oct. 3, 1995.

BACKGROUND OF THE INVENTION

1. Field of the Invention

This invention relates to a preamplifier with an equalizer. More particularly, the invention pertains to a preamplifier circuit which equalizes and amplifies in order to reduce noise and improve clarity in sound reproduction systems.

2. State of the Art

Sound engineers use preamplifiers to amplify and process sound signals to achieve volume boosting while at the same time manipulating certain frequencies. An accepted definition states that a preamplifier is "an amplifier connected to a low-level signal source to present suitable input and output impedances and provide gain so that the signal may be further processed without appreciable degradation in the signal-to-noise ratio." *The New IEEE Standard Dictionary of Electrical and Electronics Terms*, 5th Ed. (New York: The Institute of Electrical and Electronics Engineers, Inc., 1993), p. 997.

The preamplifier often includes an equalizer. Equalizer and the circuit term "filter" are generally synonymous terms, and will often be used interchangeably in this document. An equalizer is a circuit with a transfer function (frequency response) designed to compensate for undesired amplitude, phase, and frequency characteristics (noise) in the sound signal. An equalizer is a desired function to combine with an amplifier because the amplifier is often, but not exclusively, the source of the undesired noise.

It is generally understood that sound engineers use equalizers to remove noise from a sound signal. Sources of noise include the actual instruments or voices, the room or studio, the microphones, the audio amplifiers or other audio signal processing components, the recording equipment and the recording media, the speaker systems and the audio signal transmitting equipment. All systems, including the preamplifier and even the equalizer itself introduce noise. Unfortunately, state of the art equalizers still cause undesirable changes in a reproduced waveform such as phase distortion, image smear, and harshness as understood by those skilled in the art.

Some sound engineers use digital equalizers to try to avoid the above mentioned waveform changes. However, digital equalizers are costly and complex. Furthermore, digital equalizers require analog-to-digital conversion, digital processing, and digital-to-analog conversion, thus possibly further distorting the signal by the multiple conversions.

Therefore, it would be an improvement over the state of the art to provide sound engineers with an improved analog equalizer that does not add to the noise problem. It would be a further advantage to provide an analog equalizer that can amplify without causing undesirable phase distortion while providing a flat frequency response.

SUMMARY OF THE INVENTION

It is an object of the present invention to provide a new and improved preamplifier to process an input signal without appreciable degradation in the signal-to-noise ratio (SNR).

It is also an object of the invention to provide a new and improved equalizer circuit for processing and performing equalization on audio signals.

It is a further object of the invention to provide a circuit capable of selectively providing gain as well as equalization to an audio input signal.

It is another object of the invention to provide a circuit for effectively reducing distortion, thereby improving clarity in currently available sound systems.

It is still another object of the invention to provide an analog equalizer that is simple in design, relatively inexpensive and yet effective in performing equalization without significant phase shift.

It is an additional object of the invention to provide an amplifier with a switchable cutoff and adjustable gain.

It is also an object of the invention to provide such a circuit that may be implemented as part of an audio preamplifier and in other environments requiring equalization.

It is a further object of the invention to provide a gain and adjustable equalization circuit with low inserted noise.

It is an additional further object of the invention to provide a preamplifier with integral air-band equalization.

It is yet another object of the invention to provide a preamplifier with equalization which provides an output signal having a flat frequency output response.

A preamplifier for processing an audio signal includes an equalizing and amplifying circuit comprised of a plurality of parallel operational amplifiers, each with a feedback impedance circuit and an adjustable source impedance circuit. This is accomplished in a preferred embodiment by a circuit having a plurality of first operational amplifier in parallel (first stage) which then feed a second plurality of operational amplifiers in parallel (second stage).

The adjustable source impedance circuit of each operational amplifier also provides the preamplifying and equalizing circuit (preamplifier circuit) with integral air-band equalization. Air-band equalization is a super-gain region in the high audio and supersonic frequency range of a bandpass equalizing circuit. The adjustable source impedance circuit allows the sound engineer to advantageously emphasize the high frequency sounds of an audio signal. A unique supersonic drop-off frequency near forty kilohertz has significant utility in audio recordings of voices and high frequency sound instruments, even though this frequency range is beyond human hearing, and as will be explained.

A summer adds the output of the first plurality of parallel operational amplifiers. The configuration of parallel operational amplifiers, with the summer, gives the preamplifier its low noise characteristic. In parallel, each additional amplifier adds to the gain with a much smaller increase in random noise. Therefore, several parallel amplifiers with a summer have improved the SNR as compared to a single operational amplifier with the same gain in state of the art preamplifying circuits..

The preamplifier circuit may include the optional second stage amplifying and equalizing circuit. However, this stage may be bypassed completely. This second stage circuit is also comprised of a plurality of parallel operational amplifiers, each having feedback and source impedance circuits for improving the SNR of the overall preamplifier circuit.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
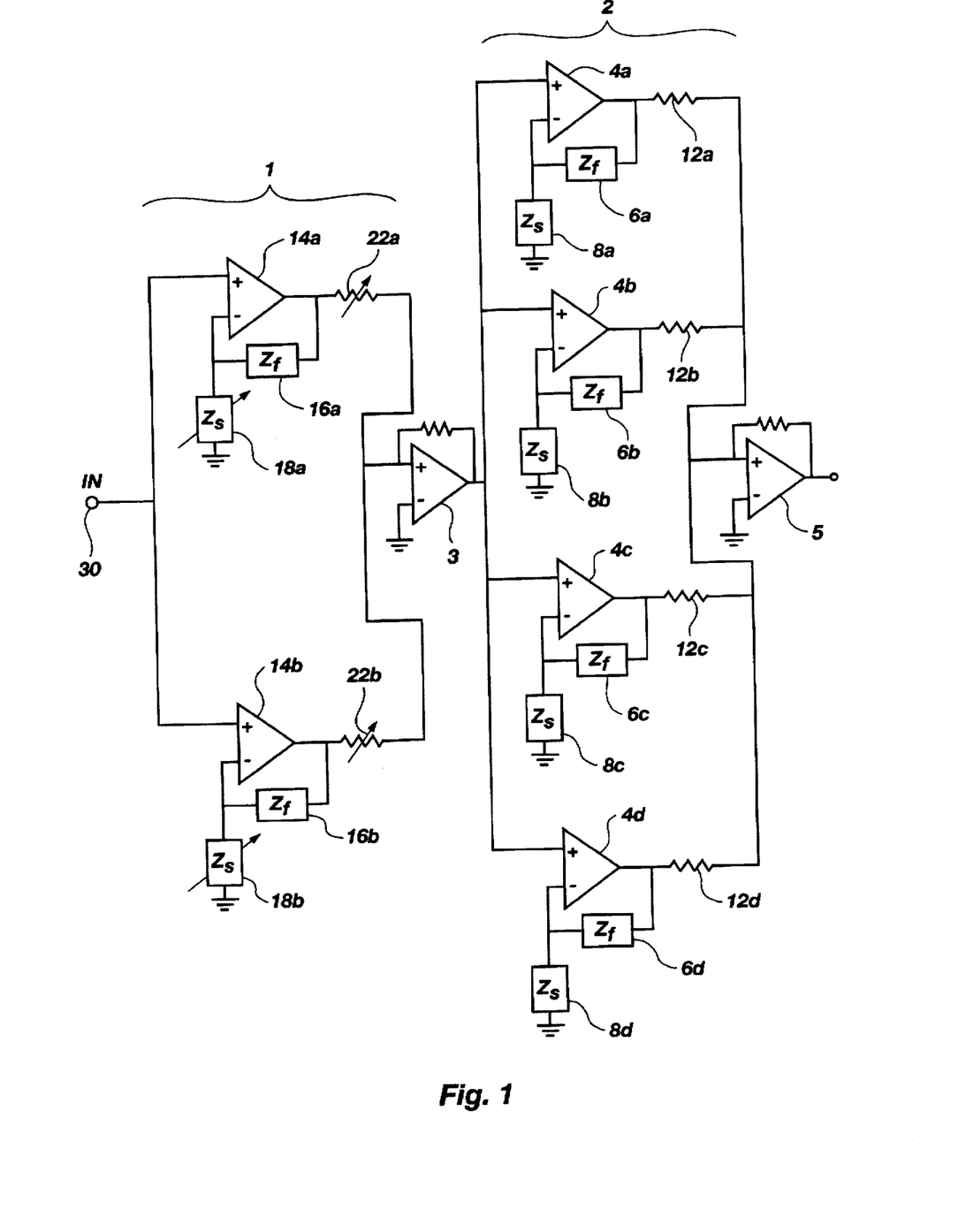
FIG. 1 shows a block diagram of a preamplifier with two parallel equalizing and amplifying circuits in series.

FIG. 1 shows an illustrative embodiment of a preamplifier circuit made in accordance with the principles of the present invention. The circuit may generally be described as a first stage equalizing and amplifying circuit 1 being connected in series with a second stage equalizing and amplifying circuit 2 to amplify and equalize an audio signal received at an IN terminal 30 and delivered at an OUT terminal 32.

It will be helpful to walk through the circuit components and interconnections of the present invention to provide a background for the advantages of the circuit to be described. In a preferred embodiment, the first stage 1 consists of parallel operational amplifiers 14 $a$–$b$, each with feedback impedance circuits 16 $a$–$b$ and adjustable source impedance circuits 18 $a$–$b$, respectively. A non-inverting terminal "+" on each operational amplifier receives the audio signal from the IN terminal 30. The adjustable source impedance circuit 18 $a$–$b$ is between the inverting terminal "–" of the operational amplifier and ground. The feedback impedance circuit 16 $a$–$b$ is between the inverting terminal and the output terminal. As configured, each operational amplifier circuit's transfer function is $1+Z_f/Z_s$, with $Z_f$ being the feedback impedance and $Z_s$ being the source impedance. It should be observed that it is possible to vary the number of operational amplifiers in this first stage.

Figure 2:
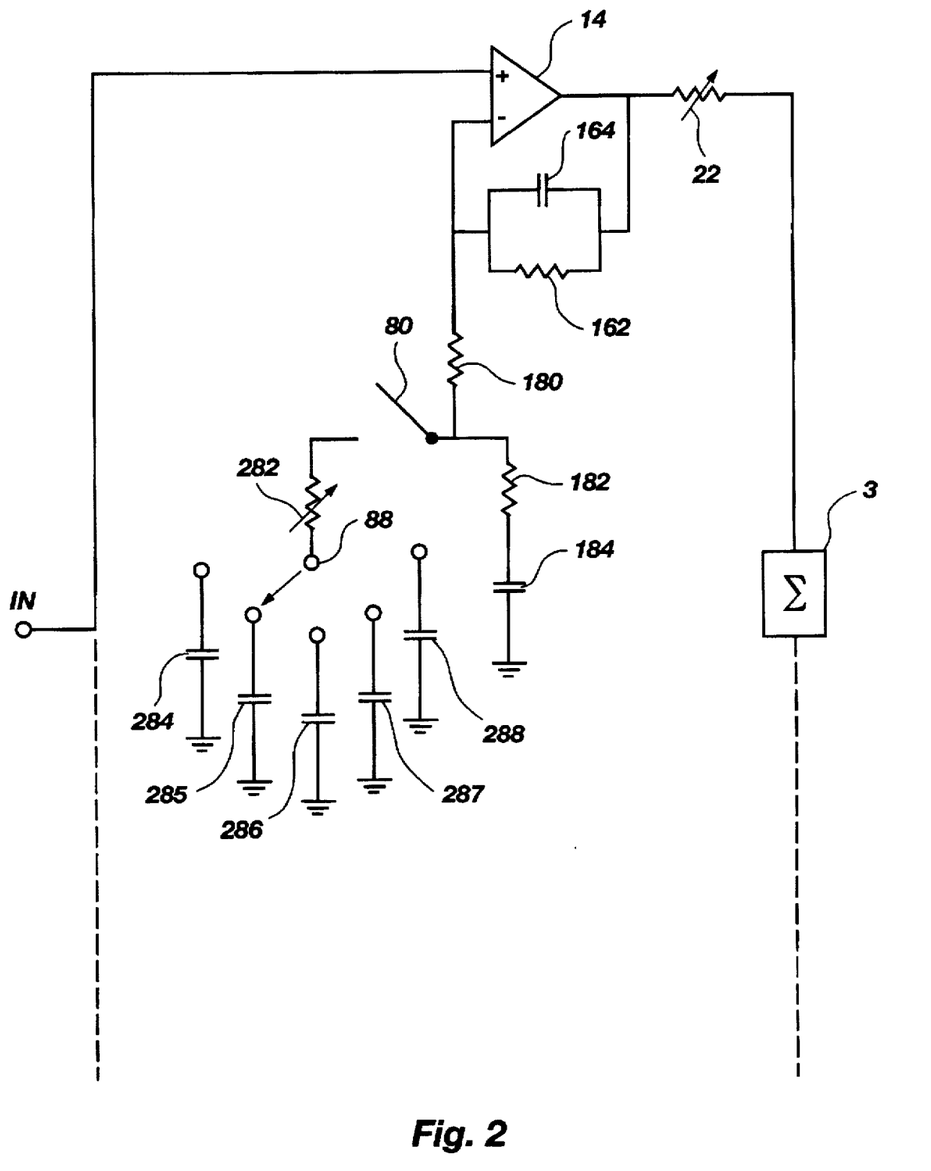
FIG. 2 shows a schematic of the first parallel preamplifier and equalizer circuit.

The adjustable source impedance circuit 18 $a$–$b$ provides the preamplifier circuit with integral air-band equalization. As understood by the inventors, air-band equalization in the first gain stage of a preamplifier is unique over the prior art. Details of the air-band equalization structure are shown in FIG. 2 and will be discussed later.

At the output of each of the parallel operational amplifiers 14 $a$–$b$ is a variable resistor 22 $a$–$d$. The variable resistors 22 $a$–$b$ in turn are coupled to the input of a first summer 3. The summer 3, for example, may be an operational amplifier circuit that produces an output signal equal to the weighted sum of the signals from each parallel operational amplifier 14 $a$–$b$. It should be observed that such summers are well known in the art. One of the purposes of the variable resistors 22 $a$–$b$ is to enable a sound engineer to attenuate each operational amplifier's output before that output signal is summed with the output signal from the other operational amplifier.

In a preferred embodiment, the second stage 2 consists of parallel operational amplifiers 4 $a$–$d$, each with feedback impedance circuits 6 $a$–$d$ and source impedance circuits 8 $a$–$d$. A non-inverting terminal "+" on each operational amplifier 4 $a$–$d$ receives the audio signal from the first stage 1 through the first summer 3. As shown, the source impedance circuit 8 $a$–$d$ is between the inverting terminal "–" of the operational amplifier and ground. The feedback impedance circuit 6 $a$–$d$ is between the inverting terminal and the output terminal. Again, the transfer function of each operational amplifier circuit is $1+Z_f/Z_s$.

At the output of each operational amplifier 4 $a$–$d$ is a resistor 12 $a$–$d$. These resistors 12 $a$–$d$ are in turn coupled to a second summer 5. The second summer 5 sums the output signals of the parallel operational amplifiers 4 $a$–$d$ to produce a total output signal at the OUT terminal 32.

In an alternative embodiment, the second stage may be bypassed completely. This bypass procedure is accomplished, for example, by inserting a switch at the output of the summer 3 of the first stage such that the second stage does not receive the output of the first stage, but instead goes directly to the OUT terminal 32. This bypass circuit is easily accomplished as recognized by those skilled in the art of electronic circuit design.

Turning now to some of the advantages of the present invention, it should be noted that the use of parallel operational amplifiers with summers gives the preamplifier its low noise output signal characteristic. Those skilled in the art will recognize that each additional parallel operational amplifier in the first stage doubles the amplified gain while only increasing the uncorrelated random noise by a factor of the square root of two. This reduced additional noise gain is the result of cancellation that occurs when the random noise added by each operation amplifier is summed. This is because if a second operational amplifier is added in parallel to a first operational amplifier, the introduced noise increases by only three decibels while the signal increases by six decibels. Thus, two operational amplifiers in parallel provide a three decibel improvement in the signal-to-noise ratio (SNR) over a single operation amplifier with the same gain.

Although FIG. 1 shows two parallel operational amplifier circuits in the first stage 1 and four parallel operational amplifiers in the second stage 2, the invention is not to be considered as so limited. Increasing the number of parallel operational amplifiers improves the SNR, but at the cost of somewhat more complexity, cost and power requirements in the circuit.

It should be obvious to those skilled in the art that stage 1 is shown with only two parallel operational amplifier circuits since each operational amplifier circuit in stage 1 is more complex than each operational amplifier circuit in stage 2. However, more parallel operational amplifier circuits may be used for either the first or second stage. Two parallel operational amplifier circuits add six decibels of gain over a single operational amplifier circuit. Four parallel preamplifier circuits thus adds twelve decibels.

FIG. 2 is a schematic of the first stage equalizing and amplifying circuit 1 showing the details of one of the parallel operational amplifier circuits. A brief description of the circuit interconnections is as follows. Feedback resistor 162, in parallel with feedback capacitor 164, is between the inverting terminal and the output terminal of the operational amplifier 14. Feedback capacitor 164 provides stability without affecting frequencies in the audio range of fifteen to twenty thousand hertz. First baseline resistor 180 and second baseline resistor 182, in series with highpass capacitor 184, is between the inverting terminal and ground. Between the first and second baseline resistors is an on/off switch 80. The on/off switch connects through a high shelf variable resistor 282 to a multi-position switch 88. The multi-position switch engages several high shelf capacitors, 284, 285, 286, 287, and 288. Each high shelf capacitor has a different capacitance.

Figure 3:
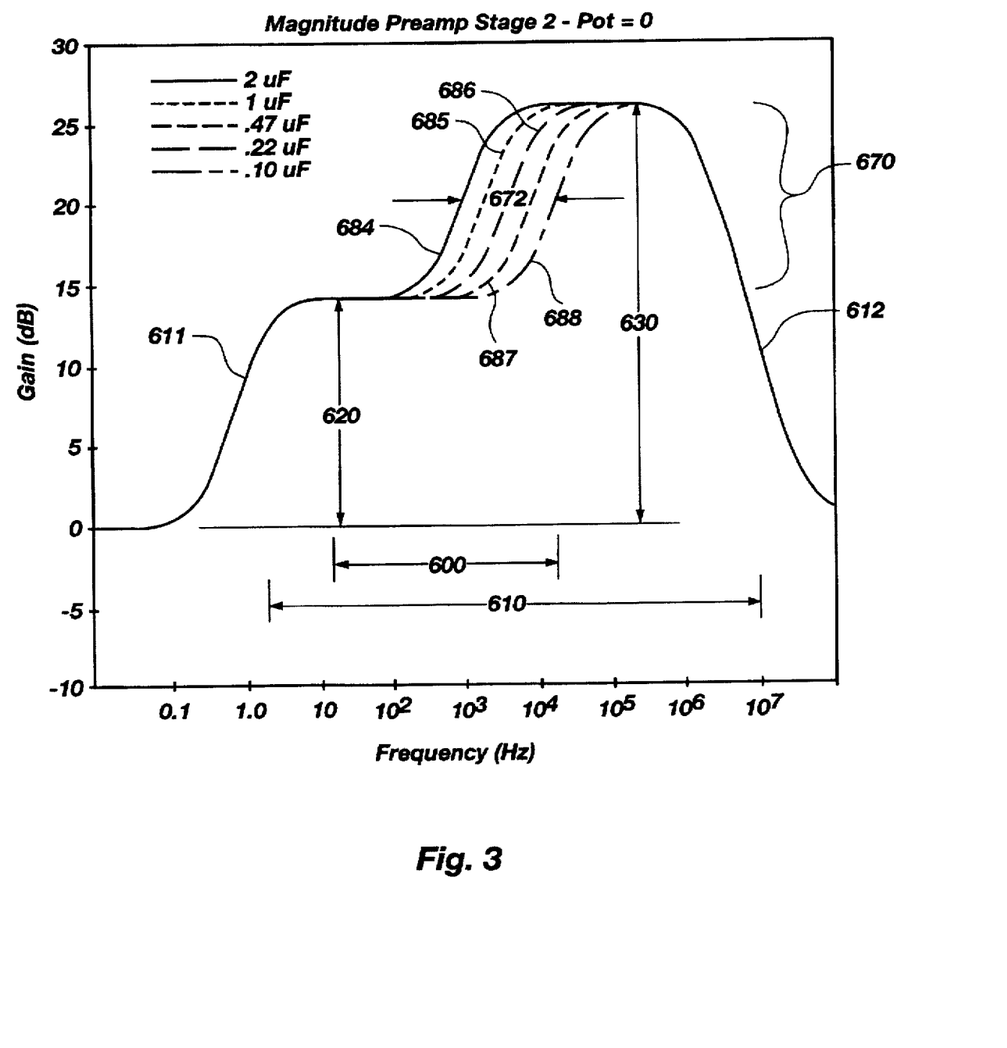
FIG. 3 shows the magnitude response with air-band equalization produced by the operational amplifier circuit of FIG. 2 with the high shelf variable resistor at zero.

When the on/off switch 80 is closed, the air-band equalization effect is enabled. As shown in FIG. 3, the air-band equalization 670 is a high audio frequency shelf in the magnitude response. FIG. 3 shows the magnitude response of the first stage 1 with air-band equalization 670 produced by the first stage parallel operational amplifier circuit 1 when the high shelf variable resistor 282 is set at zero. The gain in decibels (dB) is on the vertical axis. The frequency in hertz (Hz) is on a log scale on the horizontal axis.

The bandpass range 610 extends generally from two to 10 hertz, much broader than the audio range 600 of fifteen to 2×10⁴ hertz. The highpass capacitor 184, with first and second baseline resistors, 180 and 182, causes a low frequency drop-off 611 below two hertz to reject DC and low frequency rumble. The feedback capacitor 164, with the feedback resistor 162, causes the high frequency drop-off 612 above 10⁷ hertz. The high frequency drop-off is far above the audio range 600 so as to provide stability without affecting frequencies in the audio range. Feedback resistor 162 and the first and second baseline resistors, 180 and 182, set the baseline gain 620. In this embodiment, the baseline gain 620 is about fourteen decibels.

For the magnitude response of FIG. 3, the high shelf capacitors in FIG. 2 have the following capacitance in the preferred embodiment as shown in table 1.

TABLE 1

| Capacitor | Designation | Value |
| --- | --- | --- |
| first high shelf capacitor | 284 a,b | 2.2 µF |
| second high shelf capacitor | 285 a,b | 1.0 µF |
| third high shelf capacitor | 286 a,b | 0.47 µF |
| fourth high shelf capacitor | 287 a,b | 0.22 µF |
| fifth high shelf capacitor | 288 a,b | 0.10 µF |

With the on/off switch 80 closed and the high shelf variable resistor 282 at zero ohms, the feedback resistor 162 and the first baseline resistor 180 set a high shelf gain 630 near twenty-six decibels.

As shown in FIG. 2, multi-position switch 88 engages the high shelf capacitors. With the multi-position switch on the first high shelf capacitor 284, the circuit produces the magnitude response 684 shown with a solid line in FIG. 3. With the switch on the second high shelf capacitor 285, the low frequency 685 value of the high shelf increases as shown with a dotted line in FIG. 3. With the switch on the third 286, the low frequency value 686 increases as shown with a long dashed line. On the fourth 287, the low frequency value 687 increases as shown with a short dashed line. On the fifth 288, the low frequency value 688 increases as shown with a dotted and dashed line.

The sound engineer uses the multi-position switch 80 to select the drop-off frequency of the air-band equalizer. As shown in FIG. 3, the air-band drop-off frequencies 672 extends from about two kilohertz to about forty kilohertz for the values of capacitors selected in the preferred embodiment. A drop-off frequency near forty kilohertz is unique over the prior art because it is supersonic. However, its effect actually begins subtly at about 6 kilohertz and has significant utility in audio recordings of voice and other sources having high frequency components.

Figure 4:
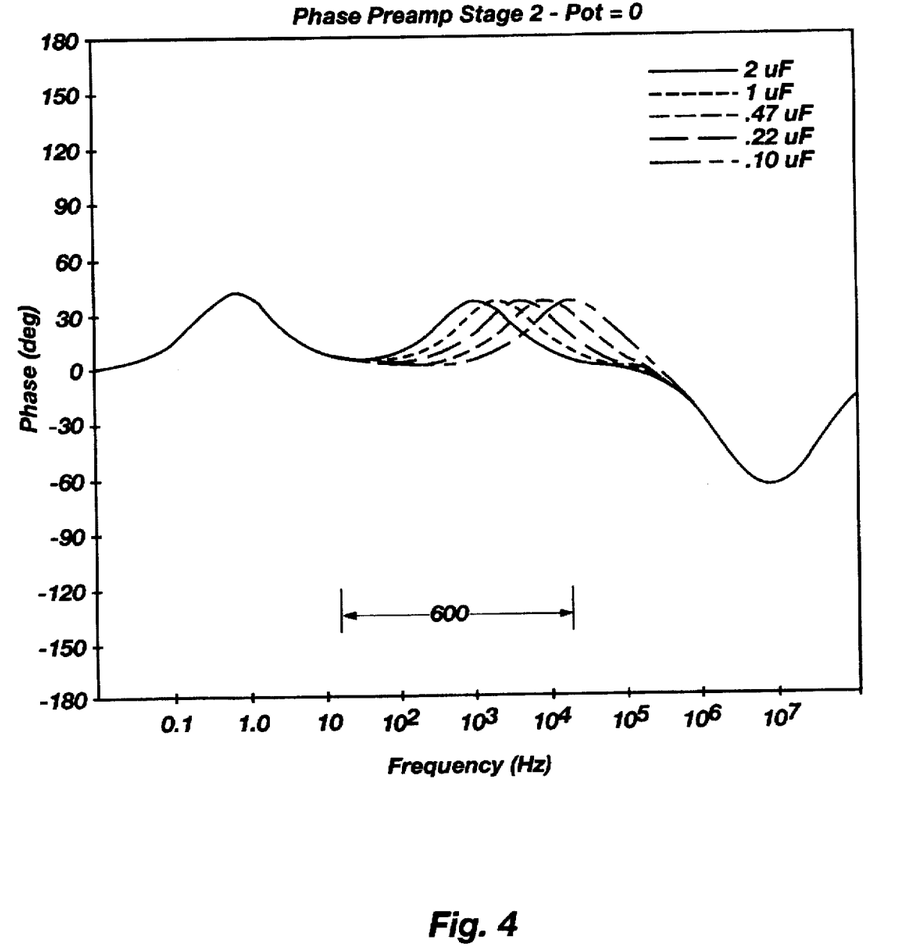
FIG. 4 shows the phase shift produced by the operational amplifier circuit of FIG. 2 with the high shelf variable resistor at zero.

FIG. 4 shows the phase shift produced by the first stage parallel operational amplifier circuit 1 with the high shelf variable resistor 282 at zero. The phase shift is in degrees on the vertical axis. The frequency is in hertz on a log scale on the horizontal axis. The air-band effect advances the phase shift in the high audio frequencies, allowing the sound engineer to brighten the sound.

Figure 5:
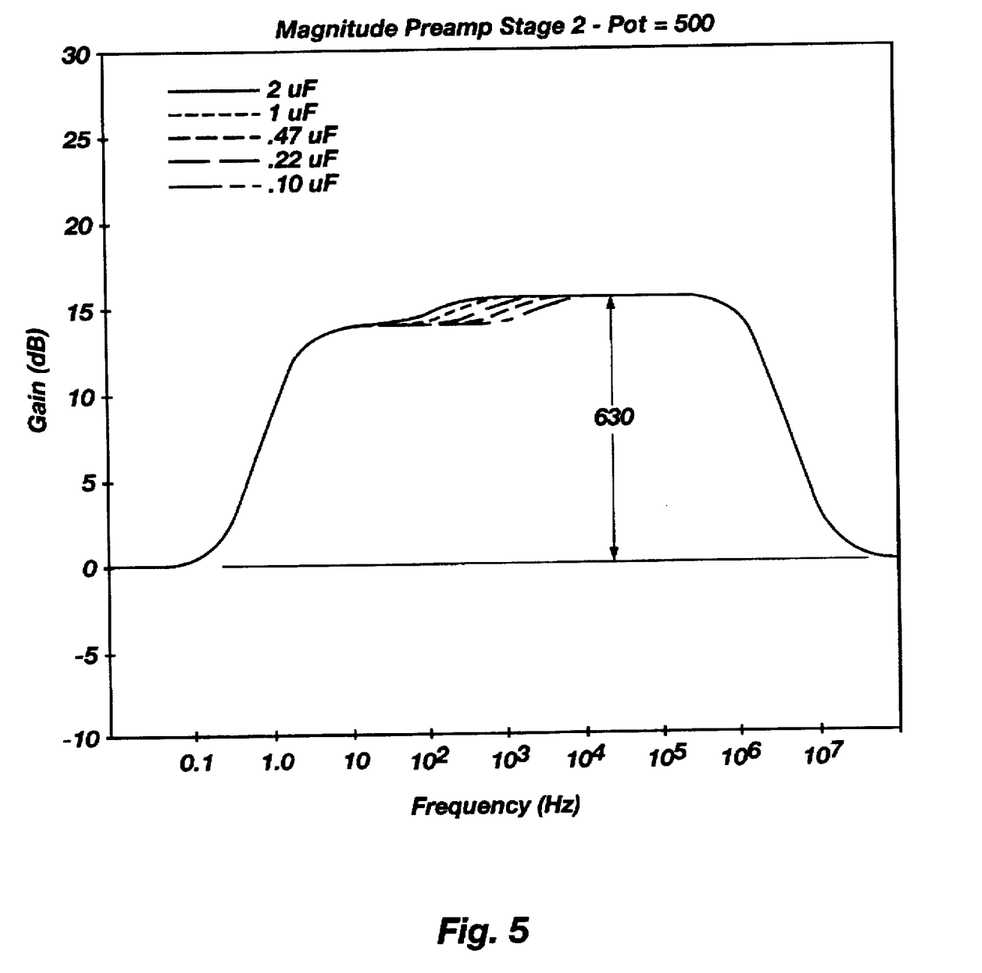
FIG. 5 shows the magnitude response produced by the operational amplifier circuit of FIG. 2 with the high shelf variable resistor at 500 ohms.

The sound engineer uses the high shelf variable resister 282 in FIG. 1 to choose the desired gain and phase shift of the air-band effect. As the resistance of the high shelf variable resister increases, the gain of the air-band decreases. FIG. 5 shows the magnitude response produced by the first stage parallel operational amplifier circuit 1 with the high shelf variable resistor 282 at 500 ohms. The high shelf gain 630 drops from twenty-six decibel to sixteen decibel for reduced air-band effect.

Figure 6:
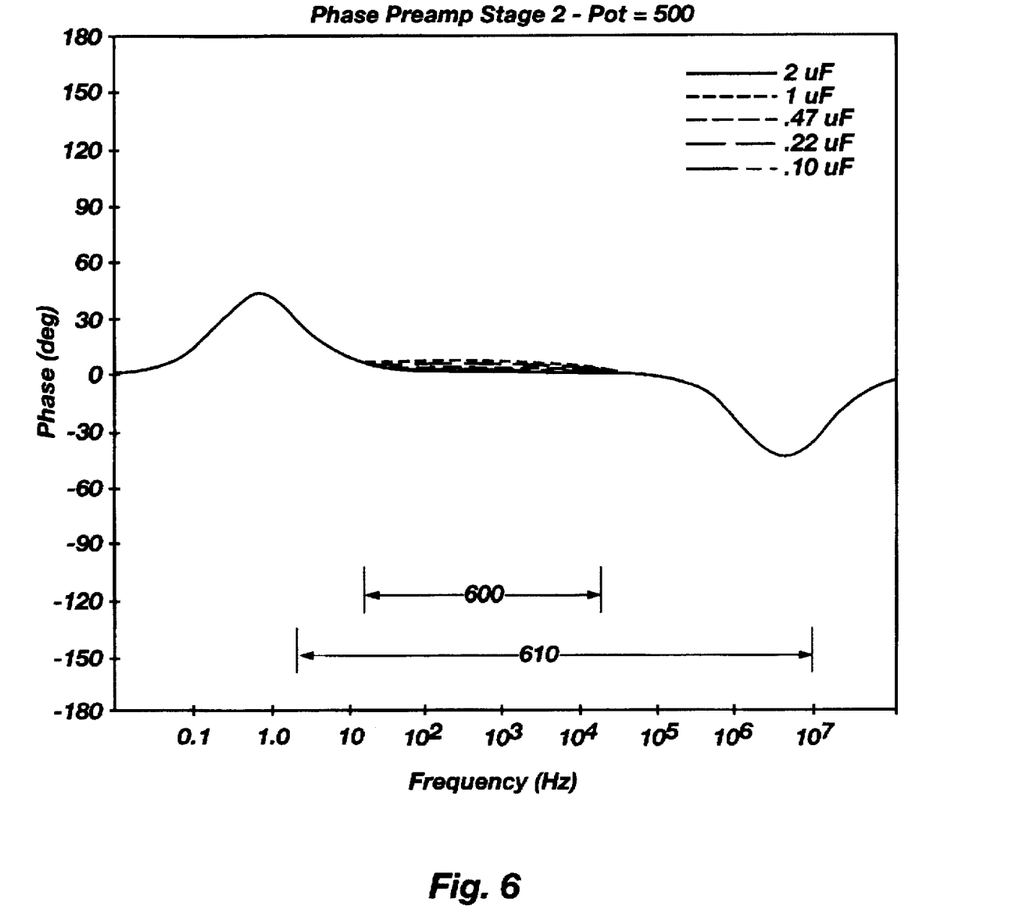
FIG. 6 shows the phase shift produced by the operational amplifier circuit of FIG. 2 with the high shelf variable resistor at 500 ohms.

FIG. 6 shows the phase shift produced by the first stage parallel operational amplifier circuit 1 with the high shelf variable resistor 282 at 500 ohms. The phase shift is advantageously generally flat and zero over the audio range 600. This result is unexpected over the prior art. The prior art suggested that the operational amplifier circuits described above would start with a 45° phase gain at the low frequencies that would continually decrease across the bandpass region 610 to a 45° phase lag at high frequencies. Such 90° phase shift across the bandpass region 610 would cause distortion when the output signals from parallel operational amplifiers are summed.

Figure 7:
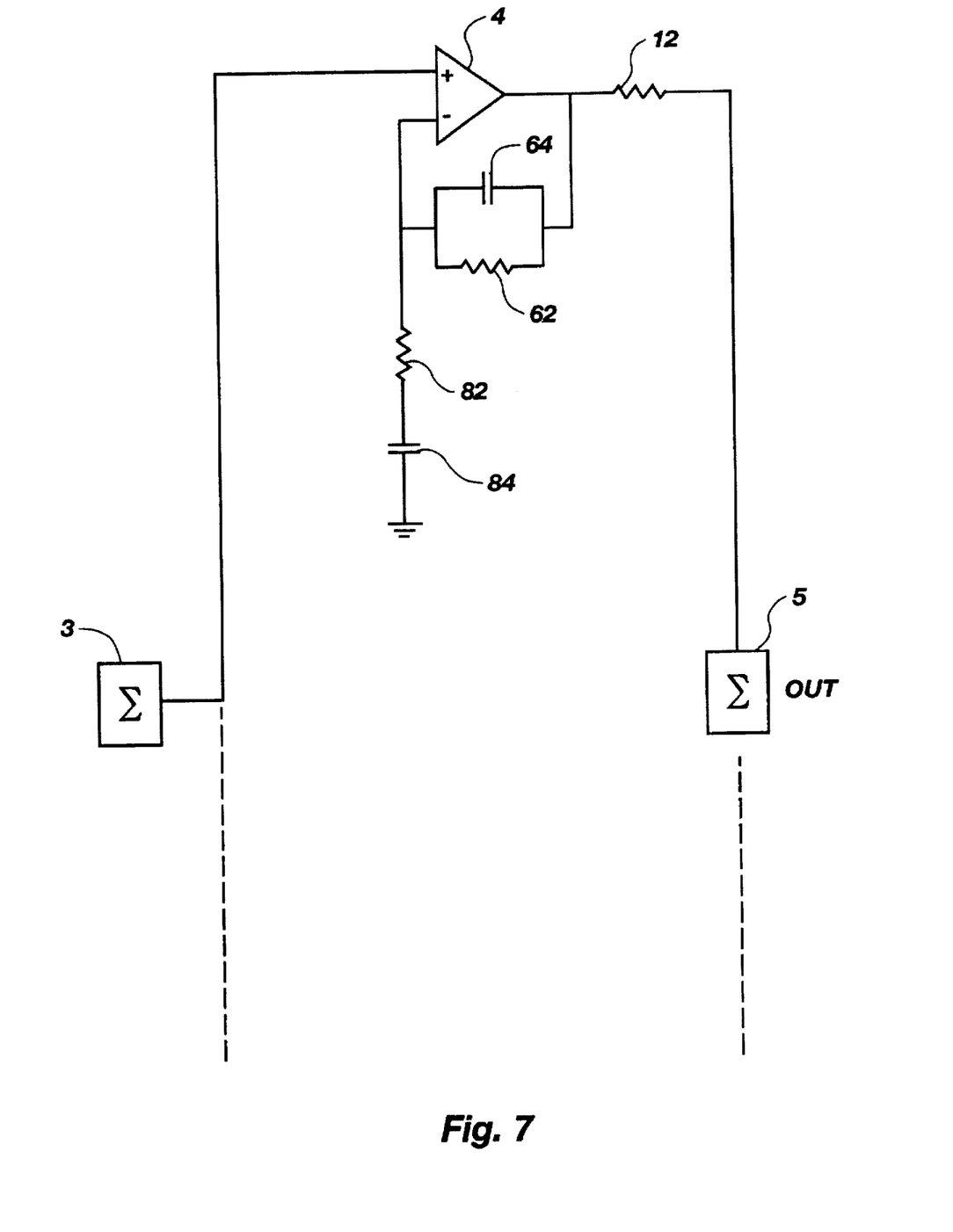
FIG. 7 shows a schematic of the second parallel preamplifier and equalizer circuit.

FIG. 7 is a schematic of the second stage equalizing and amplifying circuit 2 showing the details of one of the parallel circuits. Feedback resistor 62 in parallel with feedback capacitor 64 is between the inverting terminal and the output terminal of the operational amplifier 4, and acts as a low pass filter. Source resistor 82 in series with source capacitor 84 is between the non-inverting terminal and the output terminal and acts as a high pass filter. Resistor 12 is between the output terminal and the second summer 5.

Figure 8:
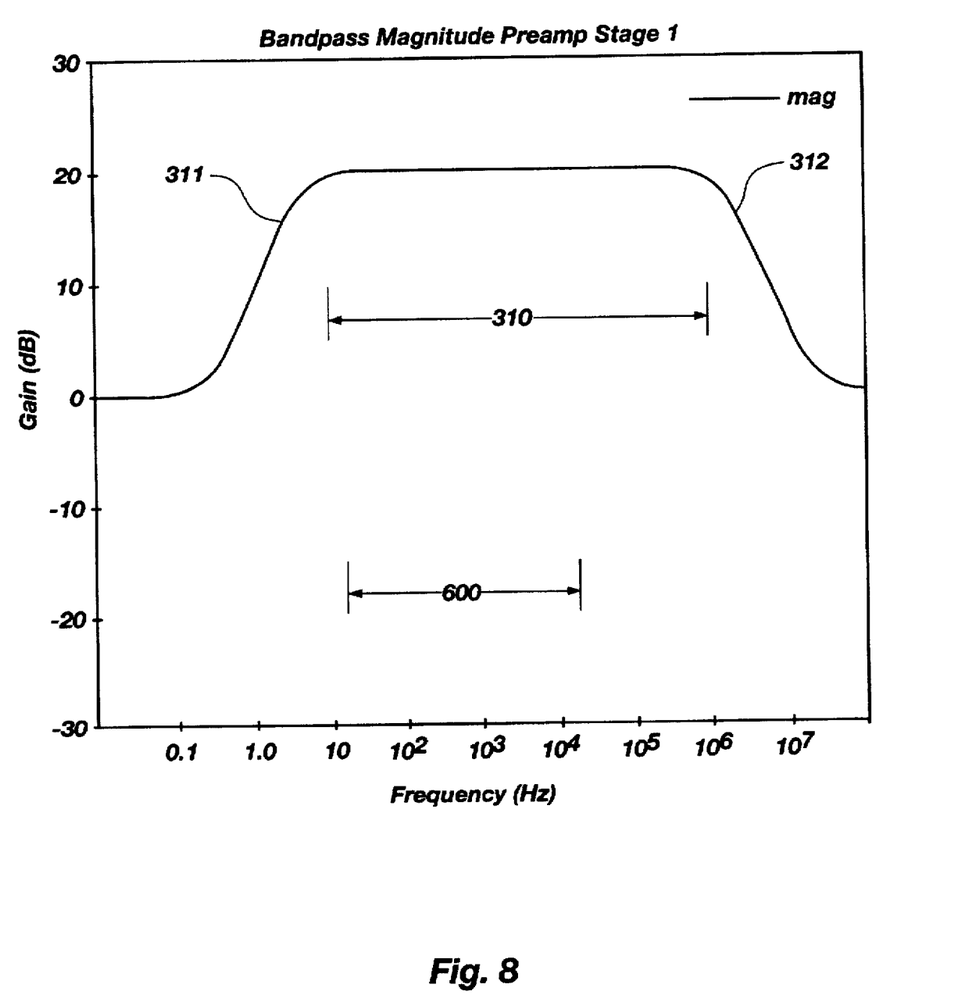
FIG. 8 shows the magnitude response produced by the operational amplifier circuit of FIG. 7.

FIG. 8 shows the magnitude response produced by the second stage 2. The gain is on the vertical axis and the frequency is on the horizontal axis. The bandpass range 310 extends generally from 10 to 10⁶ hertz. The source capacitor 84, with source resistor 82, causes the low frequency drop-off 311 below 10 hertz. The low frequency drop-off blocks DC and low frequency noise. The feedback capacitor 64, with the feedback resistor 62, causes the high frequency drop-off 312 above 10⁶ hertz, far above the audio range 600. This provides stability without affecting audio frequencies.

Figure 9:
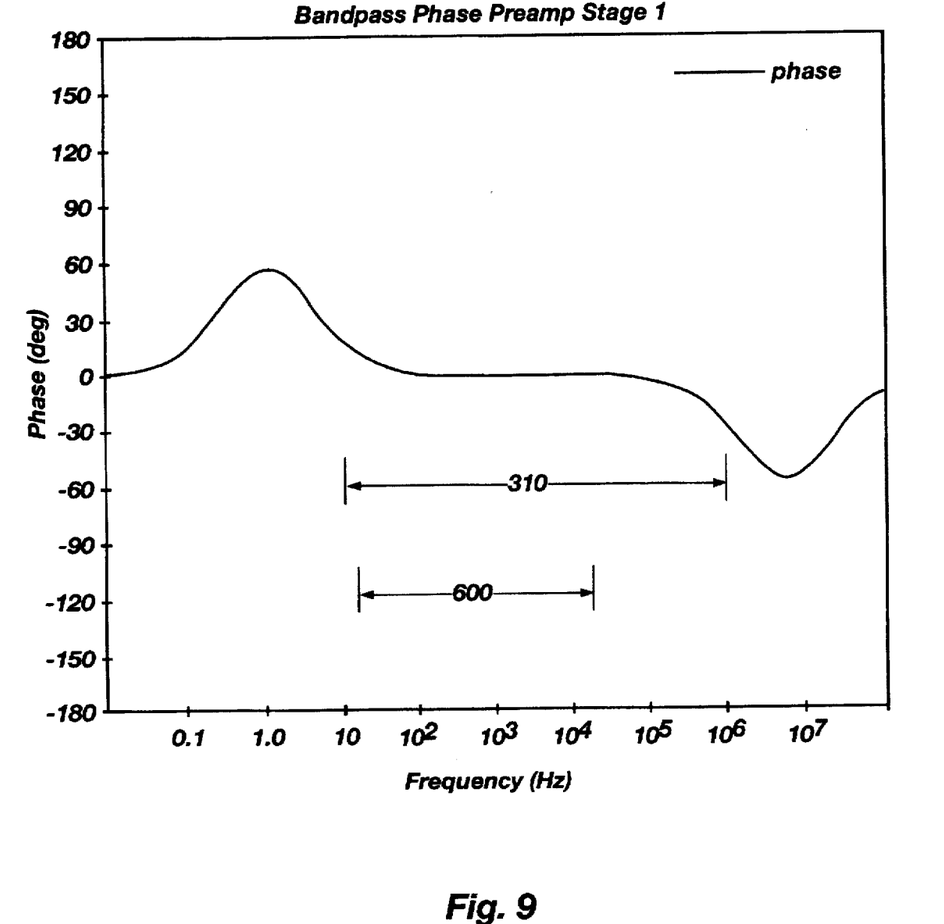
FIG. 9 shows the phase shift produced by the operational amplifier circuit of FIG. 7.

FIG. 9 shows the phase shift produced by the second stage 2. The phase is on the vertical axis and the frequency is on the horizontal axis. The phase shift is generally flat and zero both in the bandpass region 310 and across the audio range 600. As noted above, this result is unexpected as the prior art taught a continually changing phase shift across the bandpass region.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A preamplifier means for processing a received audio signal, said preamplifier means being comprised of a plurality of operational amplifier means for receiving the audio signal in parallel, then amplifying and equalizing the audio signal, each operational amplifier means of said plurality having:

a first input for receiving the audio signal;

a second input for receiving feedback from an output of the operational amplifier means, and through a feedback impedance means;

a selectable source impedance means coupled between ground and the second input for providing a selectable high bandpass filter, wherein said selectable source impedance means is an air band equalizer;

a variable resistance means coupled to the output of the operational amplifier means for attenuating an output signal; and a summing means for summing the output signal from each of the plurality of operational amplifier means.

2. The preamplifier means as defined in claim 1 wherein the preamplifier means further comprises a second plurality of operational amplifier means for receiving the processed audio signal from the summing means, then amplifying and equalizing the processed audio signal, each operational amplifier means of said second plurality having:

a first input for receiving the audio signal;

a second input for receiving feedback from an output of the operational amplifier means via a feedback impedance means;

a source impedance means coupled between ground and the second input for providing a high bandpass filter;

a resistance means coupled to the output of the operational amplifier means for attenuating an output signal; and a summing means for summing the output signal from each of the second plurality of operational amplifier means.

3. The preamplifier means as defined in claim 1 wherein the plurality of operational amplifier means is more specifically comprised of two operational amplifiers arranged in parallel.

4. The preamplifier means as defined in claim 3 wherein each of the plurality of the operational amplifiers is more specifically comprised of:

a non-inverting terminal as the first input;

an inverting terminal as the second input;

a resistor and capacitor (RC) network as the feedback impedance means; and the selectable source impedance means comprising a first resistance means coupled to the inverting terminal, a first high pass filter means coupled between the first resistance means and ground, and a variable high pass filter means in parallel with the first high pass filter means when a first switch is closed.

5. The preamplifier means as defined in claim 4 wherein the selectable source impedance means more specifically comprises:

a first resistor as the first resistance means;

a second resistor in series with a capacitor as the first high pass filter means; and a variable resistor in series with one of a plurality of capacitors via a second switch as the variable high pass filter means.

6. The preamplifier means as defined in claim 5 wherein the second switch is a multi-position switch so as to selectively designate which of a plurality of capacitors will complete the variable high pass filter means.

7. The preamplifier means as defined in claim 5 wherein the summing means comprises an operational amplifier.

8. The preamplifier means as defined in claim 2 wherein the plurality of operational amplifier means is more specifically comprised of four operational amplifiers arranged in parallel.

9. The preamplifier means as defined in claim 8 wherein each of the plurality of the operational amplifiers is more specifically comprised of:

a non-inverting terminal as the first input;

an inverting terminal as the second input;

an RC network as the feedback impedance means; and the source impedance means comprising a second high pass filter means coupled between the inverting terminal and ground.

10. The preamplifier means as defined in claim 9 wherein the source impedance means more specifically comprises a first resistor in series with a first capacitor as the second high pass filter means.

11. The preamplifier means as defined in claim 10 wherein the summing means comprises an operational amplifier.

12. The preamplifier means as defined in claim 7 wherein the output signal from the summing means of the first plurality of operational amplifiers comprises a frequency band in the audio range of human hearing.

13. The preamplifier means as defined in claim 11 wherein the output signal from the summing means of the second plurality of operational amplifiers comprises a frequency band in the audio range of human hearing.

14. The preamplifier means as defined in claim 11 wherein the output signal from the summing means of the second plurality of operational amplifiers comprises a frequency band in the range of 10 to $10^6$ Hz.

15. The preamplifier means as defined in claim 11 wherein the output signal from the summing means of the second plurality of operational amplifiers comprises a signal having a generally flat frequency response in the audio range of human hearing.

16. The preamplifier means as defined in claim 11 wherein the output signal from the summing means of the second plurality of operational amplifiers comprises a signal having generally no phase shift in the audio range of human hearing.

17. The preamplifier means as defined in claim 5 wherein each of the plurality of capacitors of the variable high pass filter means is selected to produce an air band drop-off of two kilohertz to forty kilohertz.

18. The preamplifier means as defined in claim 4 wherein the selectable source impedance means causes a high shelf gain of the output signal over a selected range of a frequency spectrum passed by each of the first plurality of operational amplifiers.

19. A preamplifier means for processing a received audio signal, said preamplifier means being comprised of a first plurality of operational amplifier means for receiving the audio signal in parallel, then amplifying and equalizing the audio signal, each operational amplifier means of said plurality having:

a first input for receiving the audio signal;

a second input for receiving feedback from an output of the operational amplifier means, and through a feedback impedance means;

a selectable source impedance means coupled between ground and the second input for providing a selectable high bandpass filter, wherein said selectable source impedance means is an air band equalizer;

a variable resistance means coupled to the output of the operational amplifier means for attenuating an output signal;

a first summing means for summing the output signal from each of the plurality of operational amplifier means;

a second plurality of operational amplifier means for receiving the processed audio signal from the first summing means, then amplifying and equalizing the processed audio signal, each operational amplifier means of said second plurality having:

a first input for receiving the audio signal;

a second input for receiving feedback from an output of the operational amplifier means via a feedback impedance means;

a source impedance means coupled between ground and the second input for providing a high bandpass filter;

a resistance means coupled to the output of the operational amplifier means for attenuating an output signal; and a summing means for summing the output signal from each of the second plurality of operational amplifier means.

20. A method for creating a preamplifier which can achieve a desired gain while minimizing noise, said method comprising the steps of:

1) selecting a desired gain and signal to noise ratio for the preamplifier;

2) arranging a plurality of operational amplifiers in parallel, each of the plurality of operational amplifiers having the desired gain and a desired signal to noise ratio (SNR) by selecting an appropriate feedback impedance means and creating an air band equalizer; and 3) summing an output of each of the plurality of operational amplifiers of step 2) so as to obtain a single output signal.

21. The method as defined in claim 20 wherein the step of creating a preamplifier which can achieve a desired gain while minimizing noise included the additional steps of:

1) selecting a desired second gain and second signal to noise ratio for a second stage of the preamplifier;

2) receiving the single output signal as an input signal;

3) arranging a second plurality of operational amplifiers so as to receive the input signal in parallel, each of the plurality of operational amplifiers having the desired second gain and a desired second signal to noise ratio (SNR) by selecting an appropriate source impedance means and feedback impedance means; and 4) summing an output of each of the plurality of operational amplifiers of step 3) so as to obtain a single output signal.

\* \* \* \* \*